(12) United States Patent
Hirmer et al.

(10) Patent No.: US 10,347,802 B2
(45) Date of Patent: Jul. 9, 2019

(54) OPTOELECTRONIC COMPONENT AND ILLUMINATION DEVICE

(71) Applicant: OSRAM Opto Semiconductors GmbH, Regensburg (DE)

(72) Inventors: Michael Hirmer, Wiesent (DE); Claus Jaeger, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/526,458

(22) PCT Filed: Nov. 12, 2015

(86) PCT No.: PCT/EP2015/076470
§ 371 (c)(1),
(2) Date: May 12, 2017

(87) PCT Pub. No.: WO2016/075256
PCT Pub. Date: May 19, 2016

(65) Prior Publication Data
US 2017/0331015 A1    Nov. 16, 2017

(30) Foreign Application Priority Data
Nov. 14, 2014   (DE) .................. 10 2014 116 687

(51) Int. Cl.
*H01L 33/58* (2010.01)
*H01L 33/50* (2010.01)

(52) U.S. Cl.
CPC ............ *H01L 33/505* (2013.01); *H01L 33/58* (2013.01)

(58) Field of Classification Search
CPC .................................. H01L 33/50; H01L 33/58
(Continued)

(56) References Cited

U.S. PATENT DOCUMENTS

| 4,210,391 A | * | 7/1980 | Cohen | G02B 5/1876 |
| | | | | 351/159.39 |
| 6,069,728 A | * | 5/2000 | Huignard | G02F 1/133526 |
| | | | | 348/E5.141 |

(Continued)

FOREIGN PATENT DOCUMENTS

| DE | 10 2011 002 483 A1 | 7/2011 |
| DE | 10 2013 204 476 A1 | 9/2014 |

(Continued)

OTHER PUBLICATIONS

Notice of Reasons for Rejection dated Mar. 27, 2018, of corresponding Japanese Application No. 2017-523792, along with an English translation.

(Continued)

*Primary Examiner* — Matthew C Landau
*Assistant Examiner* — Dmitriy Yemelyanov
(74) *Attorney, Agent, or Firm* — DLA Piper LLP (US)

(57) ABSTRACT

An optoelectronic component includes an optoelectronic semiconductor chip and an optical element, wherein the optical element includes a prism structure configured to split light emitted by the semiconductor chip into two beams and deflect the beams in a first direction relative to one another, and the optical element includes a beam deflecting structure configured to deflect both beams jointly in a second direction perpendicular to the first direction.

18 Claims, 7 Drawing Sheets

(58) Field of Classification Search
USPC .......................................................... 257/98
See application file for complete search history.

(56) References Cited

U.S. PATENT DOCUMENTS

| | | | |
|---|---|---|---|
| 2005/0024746 A1* | 2/2005 | Shimura | F21V 5/045 |
| | | | 359/742 |
| 2006/0267037 A1 | 11/2006 | Lim et al. | |
| 2007/0047254 A1* | 3/2007 | Schardt | G02B 5/0242 |
| | | | 362/607 |
| 2009/0274419 A1 | 11/2009 | Sayers et al. | |
| 2010/0177399 A1 | 7/2010 | Teng et al. | |
| 2011/0114975 A1* | 5/2011 | Eissler | H01L 25/0753 |
| | | | 257/89 |
| 2011/0149018 A1* | 6/2011 | Kroll | G03H 1/02 |
| | | | 348/40 |

FOREIGN PATENT DOCUMENTS

| | | |
|---|---|---|
| EP | 2 287 932 A2 | 2/2011 |
| JP | 2006-339641 | 12/2006 |
| JP | 2007-165464 | 6/2007 |
| JP | 2010-066722 | 3/2010 |
| WO | 2011/049373 A2 | 4/2011 |
| WO | 2014/147883 | 9/2014 |

OTHER PUBLICATIONS

English translation of First Office Action dated Jun. 5, 2018, 2018, of counterpart Chinese Application No. 201580061606.9.

* cited by examiner

OPTOELECTRONIC COMPONENT AND ILLUMINATION DEVICE

TECHNICAL FIELD

This disclosure relates to an optoelectronic component and illumination device.

BACKGROUND

It is known to use optoelectronic components, for example, light emitting diode components for illumination purposes. In this case, it is known to equip optoelectronic components with optical elements for beam shaping of the light used for illumination.

SUMMARY

We provide an optoelectronic component including an optoelectronic semiconductor chip and an optical element, wherein the optical element includes a prism structure configured to split light emitted by the semiconductor chip into two beams and deflect the beams in a first direction relative to one another, and the optical element includes a beam deflecting structure configured to deflect both beams jointly in a second direction perpendicular to the first direction.

We also provide an illumination device including the optoelectronic component including an optoelectronic semiconductor chip and an optical element, wherein the optical element includes a prism structure configured to split light emitted by the semiconductor chip into two beams and deflect the beams in a first direction relative to one another, and the optical element includes a beam deflecting structure configured to deflect both beams jointly in a second direction perpendicular to the first direction.

LIST OF REFERENCE SIGNS 100 optoelectronic component
110 illumination device
200 housing
201 top side
202 underside
210 cavity
220 edge
300 optoelectronic semiconductor chip
310 radiation emission face
320 radiation emission direction
330 emitted light
340 first beam
350 second beam
360 splitting direction
400 first optical element
401 top side
402 underside
403 circumferential edge
410 second optical element
420 third optical element
430 fourth optical element
440 fifth optical element
500 prism structure
501 first outer face
502 second outer face
510 individual prism structure
520 section
600 lens structure
700 beam deflecting structure
710 tilting
720 deflecting direction

DETAILED DESCRIPTION

We provide an optoelectronic component comprising an optoelectronic semiconductor chip and an optical element. The optical element comprises a prism structure configured to split light emitted by the semiconductor chip into two beams.

The two beams generated by this optoelectronic component may be used to illuminate two separate spatial or areal regions. Since the two beams are generated from the light emitted by only one optoelectronic semiconductor chip, changes in the ratio of the brightnesses of the two beams with respect to one another are advantageously substantially precluded. By way of example, a temperature change does not bring about a change in the ratio of the brightnesses of the two beams. In particular, what may advantageously be achieved is that both beams generated by the optoelectronic component always comprise substantially the same brightness.

By splitting the light emitted by the optoelectronic semiconductor chip of the optoelectronic component with the prism structure of the optical element, what may be achieved is that the two beams generated by the splitting of the emitted light comprise substantially the same emission characteristic as the light emitted by the optoelectronic semiconductor chip before the splitting of the light into the two beams.

The prism structure may comprise a plurality of individual prism structures arranged alongside one another. This makes it possible to form the prism structure of the optical element of the optoelectronic component with a small structural height, which enables an example of the optoelectronic component with compact external dimensions.

The optical element may comprise a lens structure. The lens structure may bring about a beam shaping of the light emitted by the semiconductor chip of the optoelectronic component and the beams generated from the emitted light. By way of example, the lens structure may concentrate the light emitted by the optoelectronic semiconductor chip. The beams generated from the emitted light may then also comprise a narrow-angular characteristic.

The lens structure may be formed in a convex fashion. By way of example, the lens structure may be formed as a convex spherical lens. However, the lens structure may, for example, also be formed as a freeform lens, as an elliptical lens or differently.

The prism structure and the lens structure may be arranged on a common surface of the optical element and superimposed on one another. In this case, superimposition of the prism structure and the lens structure may be formed as a deformation of the prism structure. Arrangement of the prism structure and the lens structure on a common surface of the optical element advantageously makes it possible to form an opposite surface of the optical element in a plane fashion or to equip it with a further optical function.

The optical element may comprise a beam deflecting structure configured to deflect both beams in a common direction. This advantageously makes it possible to deflect the beams generated by the optoelectronic component in the direction of a target region to be illuminated.

The beam deflecting structure may be configured as tilting of a surface of the optical element relative to a direction perpendicular to a radiation emission direction of the semiconductor chip. Advantageously, the beam deflecting structure of the optical element thereby makes it possible to deflect the beams generated by the optoelectronic component in a direction deviating from the radiation emission direction of the semiconductor chip. This advantageously makes it possible to arrange the optoelectronic component such that the target regions to be illuminated by the beams are located in a direction tilted relative to the radiation emission direction of the semiconductor chip.

The prism structure may be configured to deflect the beams in a first direction relative to one another. In this case, the beam deflecting structure is configured to deflect the beams jointly in a second direction perpendicular to the first direction. This advantageously enables a particularly flexible adaptation of the optoelectronic component to a geometry of a target region to be illuminated by the optoelectronic component.

The prism and beam deflecting structures may be arranged on a common surface of the optical element and superimposed on one another. In this case, the beam deflecting structure may be formed by a tilting of the prism structure. Arrangement of the prism and beam deflecting structures on a common surface of the optical element advantageously makes it possible to form an opposite surface of the optical element in a plane fashion or to equip it with a further optical function.

Each individual prism structure of the prism structure may be subdivided into a plurality of sections in the longitudinal direction. In this case, the individual sections of each prism structure are offset relative to one another in the radiation emission direction of the semiconductor chip. This makes it possible to form a tilting of the prism structure, the tilting forming the beam deflecting structure, with a small structural height. This is achieved by virtue of the fact that each individual section of each individual prism structure of the prism structure is individually tilted. Advantageously, the optical element of the optoelectronic component may thereby comprise a small height, which makes it possible to form the optoelectronic component with compact external dimensions.

The lens and beam deflecting structures may be arranged on a common surface of the optical element and superimposed on one another. In this case, the beam deflecting structure may be formed, for example, by a tilting of the lens structure. Arrangement of the lens and beam deflecting structures on a common surface of the optical element advantageously makes it possible to form an opposite surface of the optical element in a plane fashion or to equip it with an additional optical function.

The optical element may comprise an underside facing the semiconductor chip and a top side facing away from the semiconductor chip. In this case, the underside, the top side or both the underside and the top side may be formed as optically functional surfaces of the optical element.

The top side of the optical element may be formed in a plane fashion. Advantageously, the optoelectronic component is thereby handleable particularly simply, for example, in a pick and place process. Moreover, the plane top side of the optical element of the optoelectronic component advantageously exhibits particularly little susceptibility to contamination and damage.

The top side of the optical element may be oriented perpendicular to a radiation emission direction of the semiconductor chip. Advantageously, the optoelectronic component may thereby comprise a regular and simple external geometry.

The optoelectronic component may comprise a housing. In this case, the semiconductor chip is arranged on or in the housing. The optical element bears on the housing. The optoelectronic semiconductor chip may be arranged, for example, in a cavity of the housing. Advantageously, this results in a compact example of the optoelectronic component.

The underside of the optical element may comprise a circumferential edge. In this case, the circumferential edge bears on the housing. This advantageously enables a simple fixing of the optical element on the housing of the optoelectronic component. The bearing of the circumferential edge on the housing of the optoelectronic component additionally ensures at the same time compliance with a desired orientation of the optical element.

The semiconductor chip may be configured to emit light comprising a wavelength from the infrared spectral range. Advantageously, the optoelectronic component is thereby suitable for illumination purposes in which illumination with visible light is undesired.

Our illumination device comprises an optoelectronic component of the type mentioned above. The two beams generated by the optoelectronic component advantageously enable illumination of two separate spatial or areal regions. In this case, it is advantageously ensured that both spatial or areal regions are always illuminated with the same ratio of brightness, for example, with identical brightness.

The above-described properties, features and advantages and the way in which they are achieved will become clearer and more clearly understood in association with the following description of examples explained in greater detail in association with the drawings.

Figure 1:
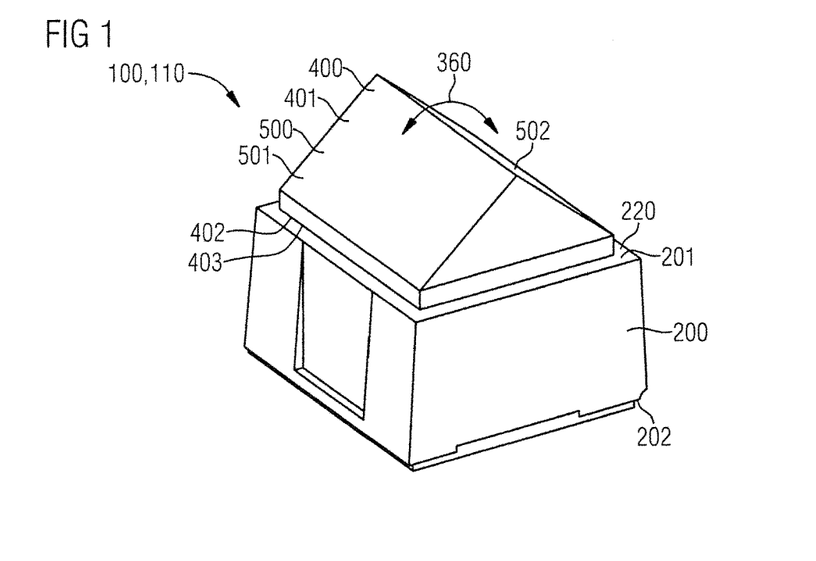
FIG. 1 schematically shows a perspective view of a part of an illumination device including an optoelectronic component including a first optical element.
Figure 2:
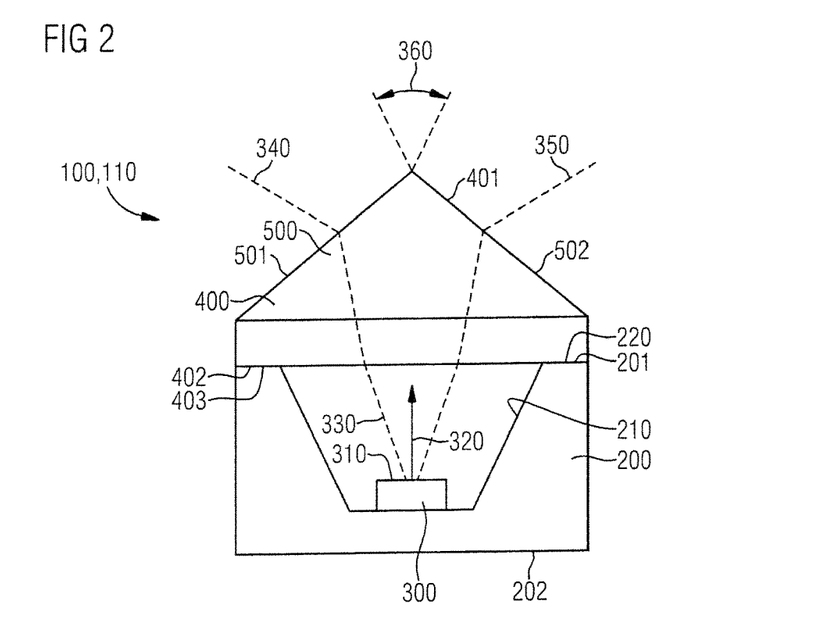
FIG. 2 schematically shows a sectional side view of the optoelectronic component.

FIG. 1 shows a schematic perspective illustration of an optoelectronic component 100. FIG. 2 shows a schematic sectional side view of the optoelectronic component 100. The optoelectronic component 100 forms a part of an illumination device 110.

The optoelectronic component 100 comprises a housing 200 comprising a top side 201 and an underside 202 opposite the top side 201. The housing 200 may be produced from a plastics material, for example, by a molding method. However, the housing 200 may also comprise a ceramic material or some other material and/or be produced by some other method.

Electrical contact pads of the optoelectronic component 100 may be arranged on the underside 202 of the housing 200. The optoelectronic component 100 may be provided, for example, as an SMT component for surface mounting, for example, for a surface mounting by reflow soldering. However, the contact pads of the optoelectronic component 100 may also be formed differently and arranged at a different position.

At its top side 201, the housing 200 comprises a cavity 210 extending into the housing 200 and is open toward the top side 201. The opening of the cavity 210 at the top side 201 of the housing 200 is delimited by a circumferential edge 220.

An optoelectronic semiconductor chip 300 is arranged on the base of the cavity 210 of the housing 200. The optoelectronic semiconductor chip 300 is configured to emit electromagnetic radiation, for example, visible light or light comprising a wavelength from the infrared spectral range. The optoelectronic semiconductor chip 300 is preferably configured as a light emitting diode chip (LED chip).

The optoelectronic semiconductor chip 300 comprises a radiation emission face 310. The optoelectronic semiconductor chip 300 is configured to emit light 330 in a radiation emission direction 320 at its radiation emission face 310. The radiation emission direction 320 is preferably oriented perpendicular to the radiation emission face 310 and directed such that the light 330 emitted by the optoelectronic semiconductor chip 300 may emerge from the cavity 210 at the top side 201 of the housing 200. The optoelectronic semiconductor chip 300 may comprise further radiation emission faces in addition to the radiation emission face 310. In particular, the optoelectronic semiconductor chip 300 may be configured as a volume emitter. A plurality of optoelectronic semiconductor chips may also be present.

The light 330 emitted by the optoelectronic semiconductor chip 300 may be emitted at the radiation emission face 310 as a divergent light cone centered around the radiation emission direction 320. The walls of the cavity 210 of the housing 200 may serve as a reflector for the light 330 emitted by the optoelectronic semiconductor chip 300. For this purpose, the walls of the cavity 210 of the housing 200 may comprise a reflective coating, for example, a coating comprising gold or aluminum, or may consist of a reflective material.

It is possible to form the housing 200 without a cavity 210. In this case, the optoelectronic semiconductor chip 300 may be arranged, for example, on the top side 201 of the housing 200. The optoelectronic semiconductor chip 300 may alternatively also be wholly or partly embedded into the material of the housing 200.

The optoelectronic component 100 comprises a first optical element 400. The first optical element 400 comprises a top side 401 and an underside 402 opposite the top side 401. The underside 402 is formed in a planar fashion. The first optical element 400 comprises an optically transparent material, for example, a glass or a silicone, an epoxy resin or some other plastic.

The first optical element 400 is arranged on the top side 201 of the housing 200 above the cavity 210. In this case, a circumferential edge 403 of the underside 402 formed on the underside 402 of the first optical element 400 bears on the edge 220 on the top side 201 of the housing 200.

If the housing 200 does not comprise a cavity 210 and the optoelectronic semiconductor chip 300 is arranged on the top side 201 of the housing 200, then the first optical element 400 is preferably arranged between the housing 200 and the first optical element 400.

The first optical element 400 comprises a prism structure 500 on its top side 401. The prism structure 500 is formed as a roof-shaped bar with a triangular cross section extending along a longitudinal direction and comprises a first outer face 501 and a second outer face 502 on the top side 401 of the first optical element 400. The first outer face 501 and the second outer face 502 are arranged at an angle with respect to one another.

The prism structure 500 of the first optical element 400 of the optoelectronic component 100 splits the light 330 emitted by the optoelectronic semiconductor chip 300 into a first beam 340 and a second beam 350. In this case, the first beam 340 is emitted at the first outer face 501 of the prism structure 500 of the first optical element 400. The second beam 350 is emitted at the second outer face 502 of the prism structure 500 of the first optical element 400. In this case, the first beam 340 and the second beam 350 are emitted in different spatial directions. The deflection of the first beam 340 and of the second beam 350 relative to the radiation emission direction 320 of the optoelectronic semiconductor chip 300 is performed in a splitting direction 360. In the case of the first optical element 400 of the optoelectronic component 100, the splitting direction 360 is arranged in a plane oriented parallel to the radiation emission direction 320 of the optoelectronic semiconductor chip 300.

The first beam 340 and the second beam 350 preferably comprise substantially the same emission characteristic as the light 330 emitted by the optoelectronic semiconductor chip 300 before the splitting of the light into the first beam 340 and the second beam 350.

The beams 340, 350 emitted by the optoelectronic component 100 may each illuminate an areal or spatial region in the illumination device 110. In this case, the angle between the beams 340, 350 emitted by the optoelectronic components 100 may be dimensioned, for example, such that light spots generated by the beams 340, 350 at a distance of, for example, 20 cm to 40 cm from the optoelectronic component 100 are at a distance of 5 cm to 15 cm from one another.

Further optical elements will be explained below with reference to FIGS. 3 to 9, which further optical elements may be provided instead of the first optical element 400 in the optoelectronic component 100. The further optical elements comprise correspondences to the first optical element 400. Identical and identically acting component parts in FIGS. 3 to 9 are provided with the same reference signs as in FIGS. 1 and 2 and will not be discussed in detail again in every case.

Figure 3:
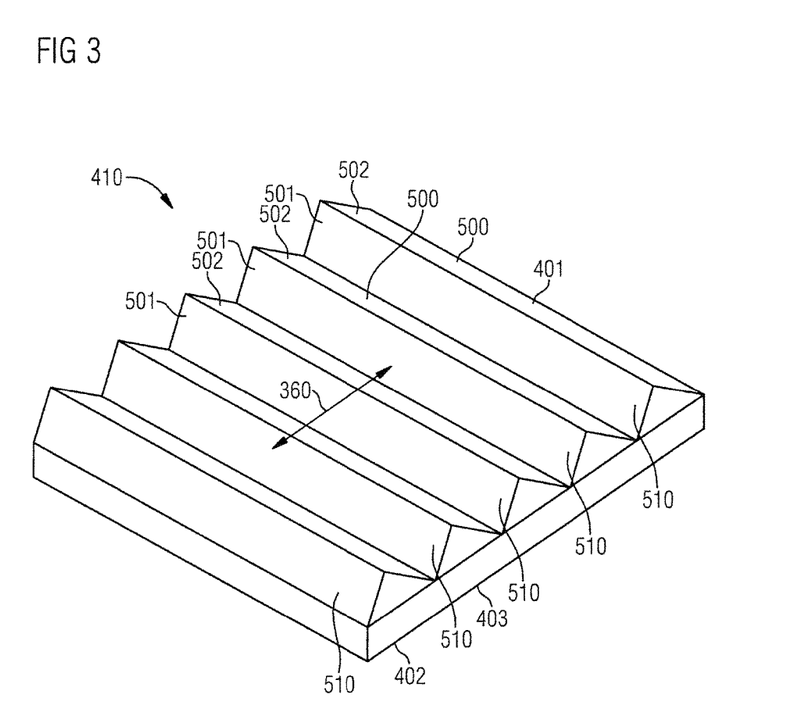
FIG. 3 schematically shows a perspective view of a second optical element.

FIG. 3 shows a schematic perspective illustration of a second optical element 410. The second optical element 410 comprises on its top side 401 a prism structure 500 provided for splitting the light 330 emitted by the optoelectronic semiconductor chip 300 of the optoelectronic component 100 into the first beam 340 and the second beam 350 in the splitting direction 360.

In the second optical element 410, the prism structure 500 comprises a plurality of individual prism structures 510 arranged alongside one another. Each individual prism structure 510 is formed as a roof-shaped bar with a triangular cross section oriented in a longitudinal direction. Each individual prism structure 510 comprises a first outer face 501 and a second outer face 502 oriented at an angle with respect to the first outer face 501. In this case, the first outer faces 501 of all the individual prism structures 510 are arranged parallel to one another. Correspondingly, the second outer faces 502 of all the individual prism structures 510 are also oriented parallel to one another. The individual prism structures 510 are arranged alongside one another in the splitting direction 360, transversely with respect to the longitudinal direction of the individual prism structures 510.

The individual prism structures 510 of the prism structure 500 of the second optical element 410 each comprise a smaller height in a direction measured parallel to the radiation emission direction 320 compared to the prism structure 500 of the first optical element 400. As a result, the second optical element 410 overall comprises a smaller height than the first optical element 400.

The prism structure 500 of the second optical element 410, the prism structure comprising the individual prism structures 510, is arranged on the top side 401 of the second optical element 410.

The underside 402 of the second optical element 410 is formed in a plane fashion and oriented perpendicular to the radiation emission direction 320 of the optoelectronic semiconductor chip 300 in the arrangement of the second optical element 410 on the housing 200 of the optoelectronic component 100.

In a variant of the second optical element 410 not shown in the figures, the prism structure 500 comprising the individual prism structures 510 is arranged on the underside 402 of the first optical element 400 and delimited by the circumferential edge 403. The top side 401 of the second optical element 410 may be formed in a plane fashion in this variant. In this example of the second optical element 410, too, the prism structure 500 of the second optical element 410 serves to split the light 330 emitted by the optoelectronic semiconductor chip 300 of the optoelectronic component 100 into the first beam 340 and the second beam 350.

Figure 4:
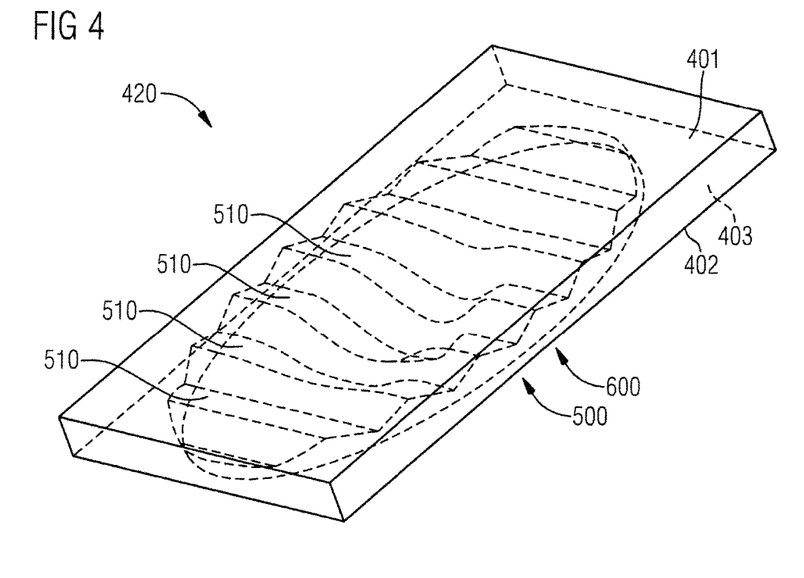
FIG. 4 schematically shows a perspective view of a third optical element.

FIG. 4 shows a schematic perspective illustration of a third optical element 420. The third optical element 420 likewise comprises a prism structure 500 comprising a plurality of individual prism structures 510. In the third optical element 420, however, the prism structure 500 is arranged on the underside 402 of the third optical element 420 and laterally delimited by the circumferential edge 403. The top side 401 of the third optical element 420 is formed in a planar fashion and oriented substantially perpendicular to the radiation emission direction 320 of the optoelectronic semiconductor chip 300 if the third optical element 420 is arranged on the top side 201 of the housing 200 of the optoelectronic component 100.

In addition to the prism structure 500, the third optical element 420 comprises a lens structure 600. The lens structure 600 shapes the light 330 emitted by the optoelectronic semiconductor chip 300 of the optoelectronic component 100 and the beams 340, 350 formed from the emitted light 330. By way of example, the lens structure 600 may concentrate the light 330 emitted by the optoelectronic semiconductor chip 300 also to concentrate the beams 340, 350 generated from the emitted light 330. In this case, the lens structure 600 is configured as a converging lens, for example, as a convex converging lens in particular, for example, as a convex spherical converging lens. However, the lens structure 600 may also comprise a different lens form.

The lens structure 600 and the prism structure 500 are both arranged on the underside 402 of the third optical element 420 and superimposed on one another. As a result, the lens structure 600 deforms the individual prism structures 510 of the prism structure 500 of the third optical element 420. The individual prism structures 510 of the prism structure 500 are not formed in a rectilinear fashion, but rather are deformed in accordance with the lens structure 600 superimposed on the prism structure 500. As a result, the first outer faces 501 and the second outer faces 502 of the individual prism structures 510 also do not form continuously planar faces. The lens structure 600 of the third optical element 420 comprises a convex, rotationally symmetrical form, for example, a spherical form, that is to say curves outward in the center region of the underside 402 of the third optical element 420. The individual prism structures 510 of the prism structure 500 of the third optical element 420 track this curvature, that is to say the outer contour of the prism structure 600.

Figure 5:
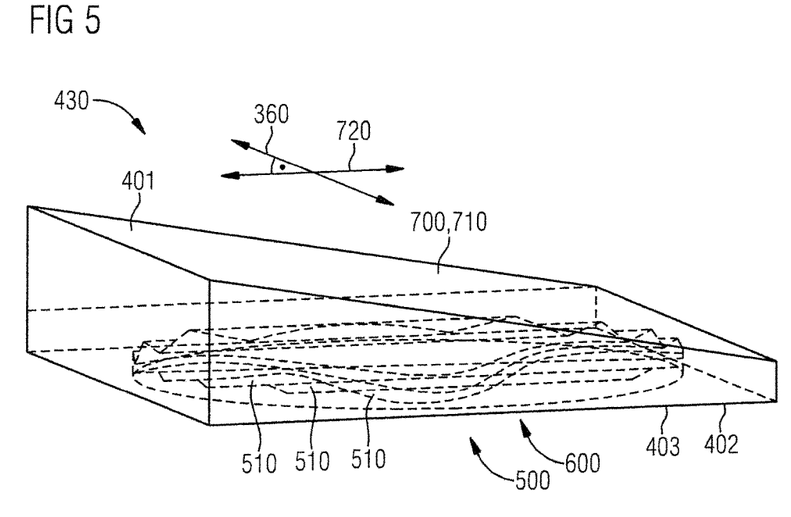
FIG. 5 schematically shows a perspective view of a fourth optical element.

FIG. 5 shows a schematic perspective and partly transparent illustration of a fourth optical element 430. The fourth optical element 430 is configured like the third optical element 420 on its underside 402, that is to say comprises a prism structure 500 comprising individual prism structures 510 and a lens structure 600 superimposed on the prism structure 500. The prism structure 500 of the fourth optical element 430 is in turn configured to split the light 330 emitted by the optoelectronic semiconductor chip 300 of the optoelectronic component 100 into the first beam 340 and the second beam 350 in the splitting direction 360.

On its top side 401, the fourth optical element 430 comprises a beam deflecting structure 700. The beam deflecting structure 700 is configured to deflect both the beams 340, 350 split by the prism structure 500 of the fourth optical element 430 in a common deflecting direction 720. In the fourth optical element 430, the deflecting direction 720 is oriented perpendicular to the splitting direction 360, but can also form a different angle than a right angle with the splitting direction 360.

The beam deflecting structure 700 on the top side 401 of the fourth optical element 430 is formed as tilting 710 of the top side 401 of the fourth optical element 430. On account of the tilting 410, the surface of the fourth optical element 430 on the top side 401 of the fourth optical element 430 is not oriented perpendicular to the radiation emission direction 320 of the optoelectronic semiconductor chip 300 of the optoelectronic component 100, but rather is tilted relative to the radiation emission direction 320.

Consequently, the fourth optical element 430 comprises three optical functions. The lens structure 600 of the fourth optical element 430 brings about beam shaping of the light 330 emitted by the optoelectronic semiconductor chip 300 of the optoelectronic component 100 and hence also of the first beam 340 and of the second beam 350, for example, concentration of the emitted light 330 and the beams 340, 350. The prism structure 500 comprising the individual prism structures 510 splits the light 330 emitted by the optoelectronic semiconductor chip 300 into the first beam 340 and the second beam 350. The beam deflecting structure 700 of the fourth optical element 430 deflects the first beam 340 and the second beam 350 jointly in the deflecting direction 720.

The prism structure 500 and the lens structure 600 of the fourth optical element 430 are jointly arranged on the underside 402 of the fourth optical element 430 and are superimposed on one another. The beam deflecting structure 700 is formed on the top side 401 of the fourth optical element 430. However, it would also be possible, for example, to form the prism structure 500, the lens structure 600 and the beam deflecting structure 700 jointly on the top side 401 or the underside 402 of the fourth optical element 430 and to superimpose them on one another. It would likewise be possible to combine the beam deflecting structure 700 with the prism structure 500 or the lens structure 600 and arrange superimposition of the beam deflecting structure 700 with the prism structure 500 or the lens structure 600 on the top side 401 or the underside 402 of the fourth optical element 430.

Figure 6:
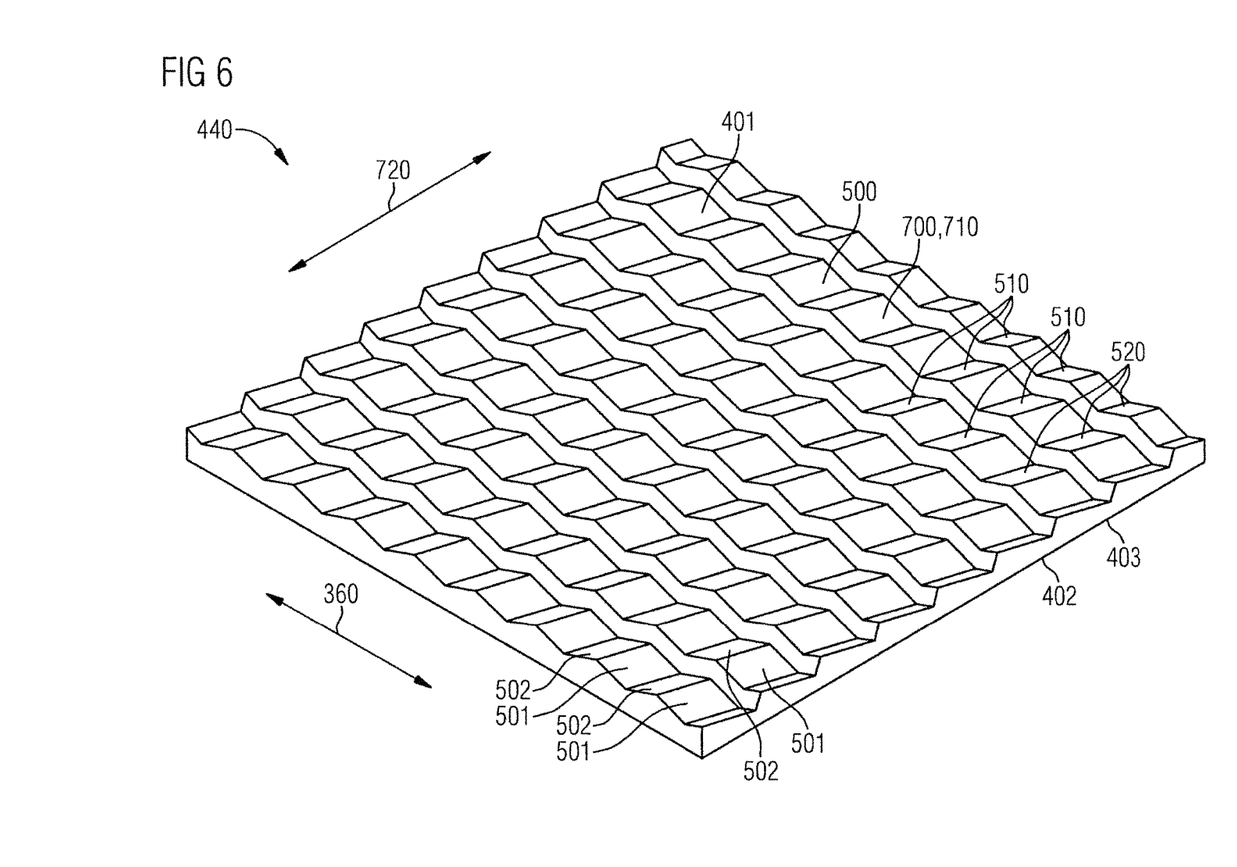
FIG. 6 schematically shows a first perspective view of a fifth optical element.
Figure 7:
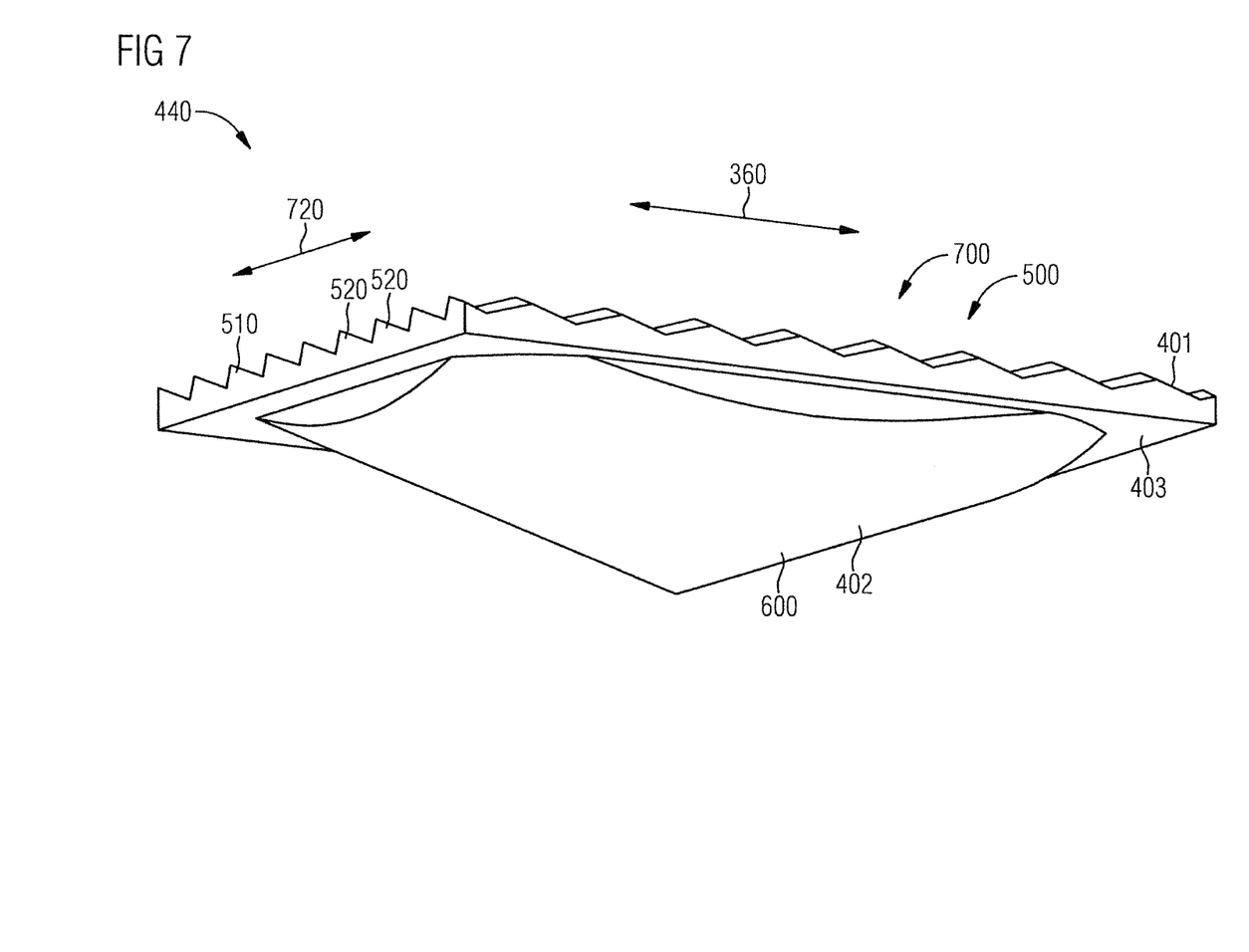
FIG. 7 schematically shows a further perspective view of a fifth optical element.
Figure 8:
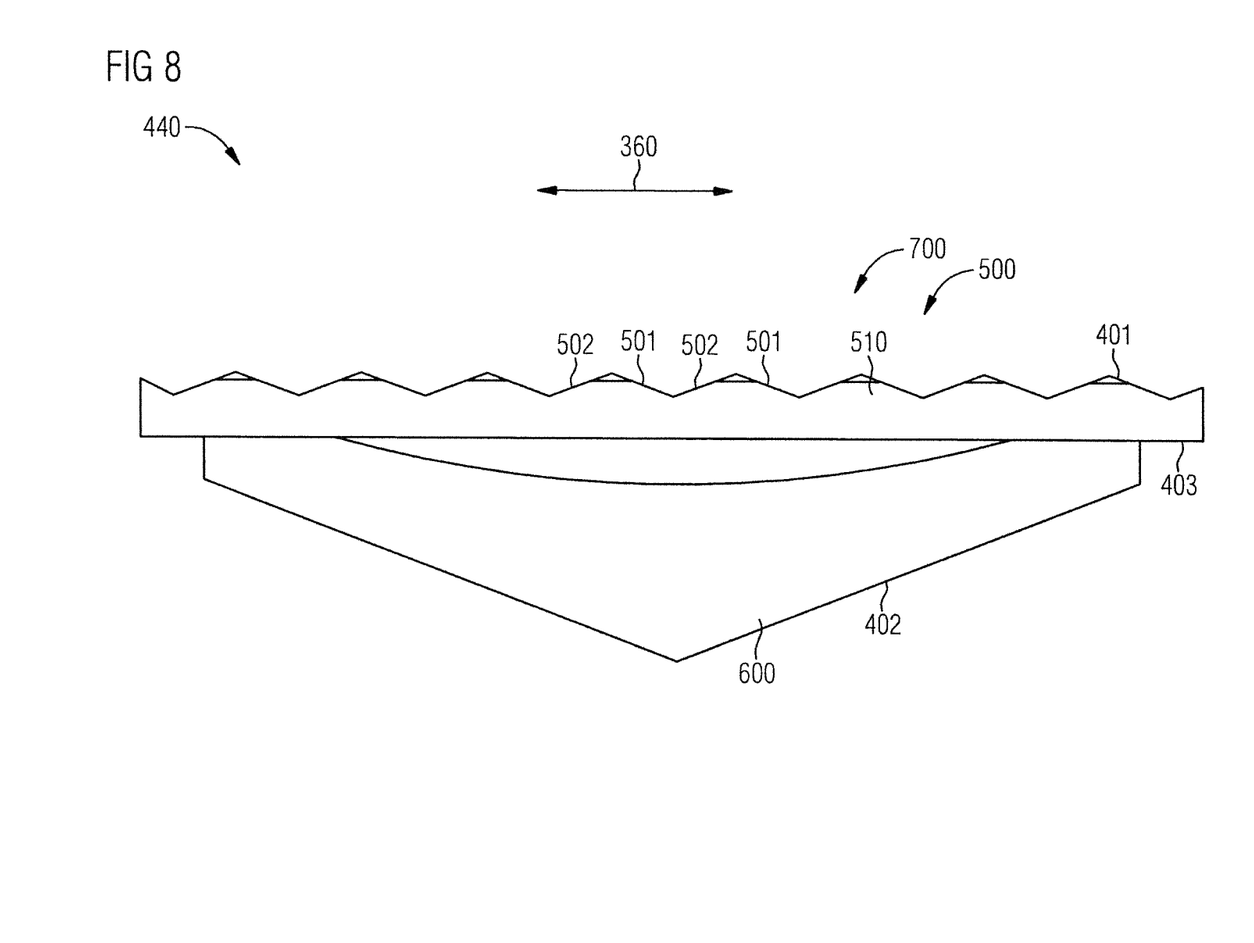
FIG. 8 schematically shows a first sectional view of the fifth optical element.
Figure 9:
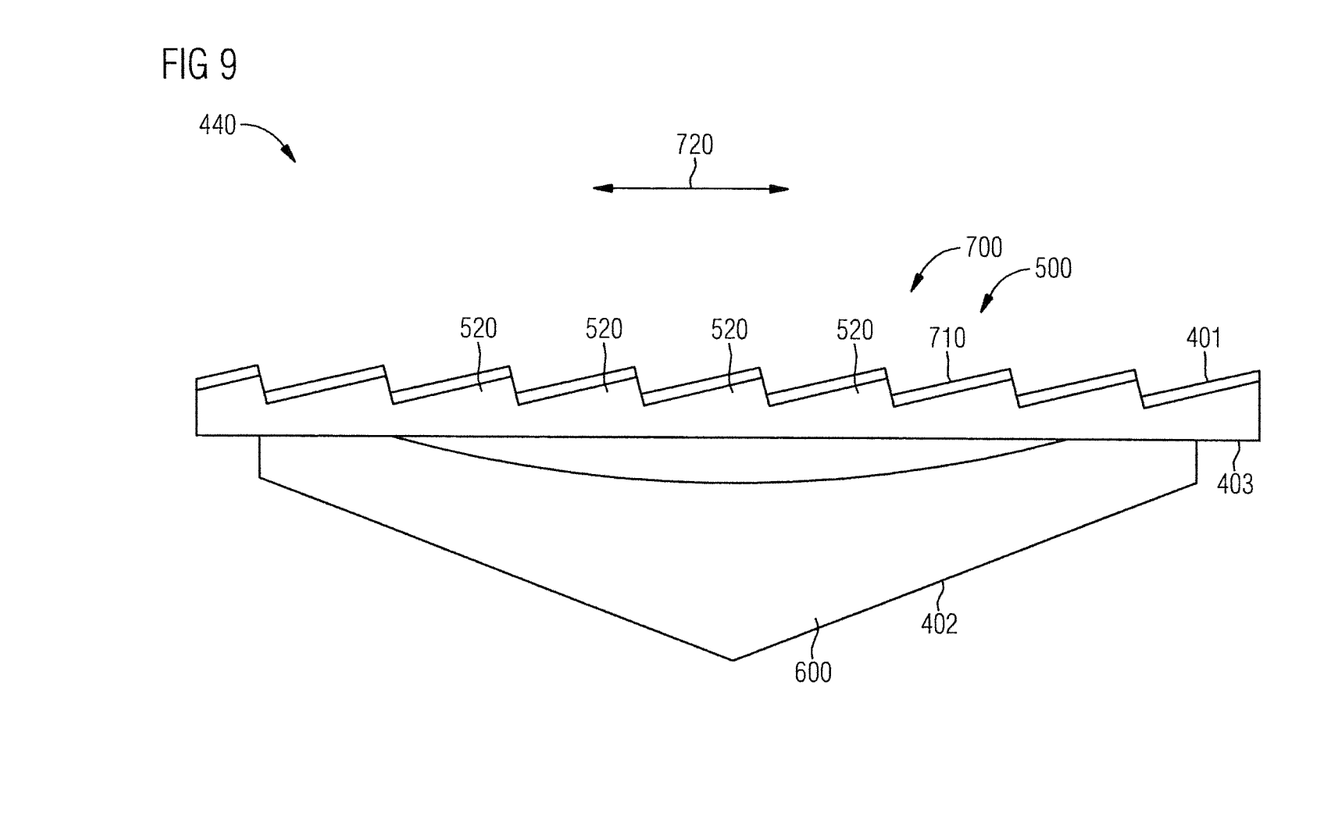
FIG. 9 schematically shows a further sectional view of the fifth optical element.

FIG. 6 shows a schematic perspective view of the top side 401 of a fifth optical element 440. FIG. 7 shows a schematic perspective view of the underside 402 of the fifth optical element 440. FIG. 8 shows a schematic side view of the fifth optical element 440 from a first viewing direction. FIG. 9 shows a schematic side view of the fifth optical element 440 from a second viewing direction perpendicular to the first viewing direction.

The fifth optical element 440 comprises a prism structure 500 on its top side 401, the prism structure being provided for splitting the light 330 emitted by the optoelectronic semiconductor chip 300 of the optoelectronic component 100 into the first beam 340 and the second beam 350 in the splitting direction 360. The prism structure 500 in turn comprises a plurality of individual prism structures 510 arranged alongside one another in the splitting direction 360 and extend in a longitudinal direction perpendicular to the splitting direction 360. Each individual prism structure 510 comprises a first outer face 501 and a second outer face 502 arranged at an angle relative to the first outer face 501.

Unlike in the prism structure 500 of the second optical element 410, the individual prism structures 510 of the prism structure 500 of the fifth optical element 440 are each subdivided into a plurality of individual sections 520 along their longitudinal direction. Each section 520 of each individual prism structure 510 of the prism structure 500 comprises a tilting 710 forming a beam deflecting structure 700 of the fifth optical element 440. The beam deflecting structure 700 of the fifth optical element 440 is thus likewise arranged on the top side 401 of the fifth optical element 440 and superimposed on the prism structure 500. The beam deflecting structure 700 of the fifth optical element 440 is configured to deflect the beams 340, 350 split by the prism structure 500 jointly in the deflecting direction 720 oriented perpendicular to the splitting direction 360 and thus parallel to the longitudinal direction of the individual prism structures 510.

All the individual sections 520 of all the individual prism structures 510 of the prism structure 500 of the fifth optical element 440 comprise the tilting 710. The individual sections 520 of an individual prism structure 510 are each offset relative to one another in the radiation emission direction 320 of the optoelectronic semiconductor chip 300 such that the tilted outer faces 501, 502 of the individual prism structures 510 comprise sawtooth-shaped offsets, as is discernible in the side view in FIG. 9. As a result, the height of the superimposition of the prism structure 500 and the beam deflecting structure 700 in a direction parallel to the radiation emission direction 320 of the optoelectronic semiconductor chip 300 is reduced in comparison with a continuous tilting 710 of the individual prism structures 510 without an offset of the individual sections 520 of the individual prism structures 510.

A lens structure 600 is formed on the underside 402 of the fifth optical element 440. The lens structure 600 on the underside 402 is in turn delimited laterally by a circumferential edge 403 that bears on the edge 220 of the housing 200 in the arrangement of the fifth optical element 440 on the top side 201 of the housing 200 of the optoelectronic component 100.

The lens structure 600 of the fifth optical element 440 in turn serves for the beam shaping of the light 330 emitted by the optoelectronic semiconductor chip 300 and thus also for the beam shaping of the beams 340, 350 obtained from the emitted light 330. The lens structure 600 is configured as a rotationally symmetrical convex lens structure that curves outward on the underside 402 of the fifth optical element 440. However, it is also be possible to configure the lens structure 600 with a different form in particular, for example, as a freeform lens, as a spherical lens or as an elliptical lens.

Our components and devices have been illustrated and described in greater detail on the basis of the preferred examples. Nevertheless, this disclosure is not restricted to the examples disclosed. Rather, other variations may be derived from by those skilled in the art, without departing from the scope of protection of the appended claims.

This application claims priority of DE 10 2014 116 687.6, the subject matter of which is incorporated herein by reference.

The invention claimed is:

1. An optoelectronic component comprising an optoelectronic semiconductor chip and an optical element,
   wherein the optical element comprises a prism structure configured to split light emitted by the semiconductor chip into two beams and deflect the beams in a first direction relative to one another,
   the optical element comprises a beam deflecting structure configured to deflect both beams jointly in a second direction perpendicular to the first direction,
   the prism structure and the beam deflecting structure are arranged on a common surface of the optical element and superimposed on one another, and
   the prism structure and the beam deflecting structure are in direct physical contact.

2. The optoelectronic component according to claim 1, wherein the prism structure comprises a plurality of individual prism structures arranged alongside one another.

3. The optoelectronic component according to claim 1, wherein the optical element comprises a lens structure.

4. The optoelectronic component according to claim 3, wherein the lens structure is in a convex shape.

5. The optoelectronic component as claimed in claim 3, wherein the prism structure and the lens structure are arranged on a common surface of the optical element and are superimposed on one another.

6. The optoelectronic component according to claim 1, wherein the beam deflecting structure is configured as tilting of a surface of the optical element relative to a plane perpendicular to a radiation emission direction of the semiconductor chip.

7. The optoelectronic component according to claim 2, wherein each individual prism structure of the prism structure is subdivided into a plurality of sections in the longitudinal direction, and
   individual sections of each prism structure are offset relative to one another in the radiation emission direction of the semiconductor chip.

8. The optoelectronic component according to claim 3, wherein the lens structure and the beam deflecting structure are arranged on a common surface of the optical element and superimposed on one another.

9. The optoelectronic component according to claim 1, wherein the optical element comprises an underside facing the semiconductor chip and a top side facing away from the semiconductor chip.

10. The optoelectronic component according to claim 9, wherein the top side of the optical element is formed in a planar shaped.

11. The optoelectronic component according to claim 9, wherein the top side of the optical element is oriented perpendicular to a radiation emission direction of the semiconductor chip.

12. The optoelectronic component according to claim 9, wherein the optoelectronic component comprises a housing,
the semiconductor chip is arranged on or in the housing, and
the optical element bears on the housing.

13. The optoelectronic component according to claim 12, wherein the underside of the optical element comprises a circumferential edge, and
the circumferential edge bears on the housing.

14. The optoelectronic component according to claim 1, wherein the semiconductor chip is configured to emit light comprising a wavelength from the infrared spectral range.

15. An illumination device comprising the optoelectronic component according to claim 1.

16. The optoelectronic component according to claim 6, wherein each individual prism structure of the prism structure is subdivided into a plurality of sections in the longitudinal direction, and
individual sections of each prism structure are offset relative to one another in the radiation emission direction of the semiconductor chip.

17. The optoelectronic component according to claim 1, wherein each individual prism structure of the prism structure is subdivided into a plurality of sections in the longitudinal direction, and
individual sections of each prism structure are offset relative to one another in the radiation emission direction of the semiconductor chip.

18. An optoelectronic component comprising an optoelectronic semiconductor chip and an optical element,
wherein the optical element comprises a prism structure configured to split light emitted by the semiconductor chip into two beams and deflect the beams in a first direction relative to one another,
the optical element comprises a beam deflecting structure configured to deflect both beams jointly in a second direction perpendicular to the first direction,
the optical element comprises a lens structure,
the prism structure and the lens structure are arranged on a common surface of the optical element and are superimposed on one another,
the beam deflecting structure is configured as tilting of a surface of the optical element relative to a plane perpendicular to a radiation emission direction of the semiconductor chip, and
the prism structure and the beam deflecting structure are in direct physical contact.

* * * * *